(12) United States Patent
Kushihara et al.

(10) Patent No.: US 12,191,872 B2
(45) Date of Patent: Jan. 7, 2025

(54) R/D CONVERSION METHOD AND R/D CONVERTER

(71) Applicant: TAMAGAWA SEIKI CO., LTD., Nagano-ken (JP)

(72) Inventors: Hiroshi Kushihara, Nagano-ken (JP); Hirofumi Maruyama, Nagano-ken (JP); Ryohei Ushikusa, Nagano-ken (JP); Shinichi Arai, Nagano-ken (JP)

(73) Assignee: TAMAGAWA SEIKI CO., LTD., Nagano-Ken (JP)

( * ) Notice: Subject to any disclaimer, the term of this patent is extended or adjusted under 35 U.S.C. 154(b) by 392 days.

(21) Appl. No.: 17/760,546

(22) PCT Filed: Sep. 10, 2020

(86) PCT No.: PCT/JP2020/034245
§ 371 (c)(1),
(2) Date: Mar. 15, 2022

(87) PCT Pub. No.: WO2021/124624
PCT Pub. Date: Jun. 24, 2021

(65) Prior Publication Data
US 2022/0329249 A1    Oct. 13, 2022

(30) Foreign Application Priority Data
Dec. 19, 2019   (JP) .................................. 2019-228803

(51) Int. Cl.
*H03M 1/06* (2006.01)
*G01B 7/30* (2006.01)
*G01D 5/244* (2006.01)

(52) U.S. Cl.
CPC ............ *H03M 1/0602* (2013.01); *G01B 7/30* (2013.01); *G01D 5/24476* (2013.01); *H03M 1/0626* (2013.01)

(58) Field of Classification Search
CPC ............... G01D 5/20; G01D 5/12; G01D 5/02
(Continued)

(56) References Cited

U.S. PATENT DOCUMENTS

| | | | |
|---|---|---|---|
| 2009/0133168 A1* | 5/2009 | Ando .................... | G01Q 10/065 850/33 |
| 2015/0052988 A1* | 2/2015 | Price ..................... | E21B 49/003 73/152.17 |
| 2015/0276373 A1* | 10/2015 | Ide ............................ | H02P 6/16 324/207.16 |

FOREIGN PATENT DOCUMENTS

| | | |
|---|---|---|
| JP | 2009-150826 | 7/2009 |
| JP | 2011-196995 | 10/2011 |

(Continued)

OTHER PUBLICATIONS

International Search Report issued Nov. 10, 2020 in International (PCT) Application No. PCT/JP2020/034245.
(Continued)

*Primary Examiner* — Peguy Jean Pierre
(74) *Attorney, Agent, or Firm* — Wenderoth, Lind & Ponack, L.L.P.

(57) ABSTRACT

An R/D conversion method includes a step of removing a frequency band including a frequency component that is twice an excitation frequency of excitation signals of a resolver (30) from a digital angle value ($\varphi$). The R/D conversion method further includes a step of outputting, by the resolver (30), the resolver signals having a phase difference that corresponds to an angle of the resolver with respect to the excitation signals, respectively, and a step of feeding back the digital angle value ($\varphi$) includes feeding back the digital angle value ($\varphi$) to the resolver signals.

8 Claims, 3 Drawing Sheets

(ANGLE DETECTION DEVICE IN FIRST EMBODIMENT)

(58) Field of Classification Search
USPC .................................................. 341/116, 155
See application file for complete search history.

(56) References Cited

FOREIGN PATENT DOCUMENTS

| | | |
|---|---|---|
| JP | 2013-221917 | 10/2013 |
| JP | 2018-109596 | 7/2018 |
| JP | 2018-146243 | 9/2018 |
| JP | 2018-205166 | 12/2018 |

OTHER PUBLICATIONS

JEM-TR 187, "Glossary of terms and definitions for resolver systems", 1993, with partial English translation (cited in specification).
Notice of Reasons for Refusal issued Nov. 24, 2021 in Japanese Application No. 2019-228803 with English translation.

* cited by examiner

FREQUENCY CHARACTERISTIC OF FILTER 24

R/D CONVERSION METHOD AND R/D CONVERTER

TECHNICAL FIELD

The present invention relates to an R/D conversion method and an R/D converter, and more particularly, to an R/D conversion method and an R/D converter to be used for a resolver.

BACKGROUND ART

There is known a technology in which two-phase excitation signals are used when signals of a resolver are processed to output a digital angle. Further, in the technology, a technology with which, even when a partial signal is missing to result in a signal open phase state corresponding to a resolver of a one-phase excitation/two-phase output type or a resolver of a two-phase excitation/one-phase output type, the digital angle can be kept being output is known as the technology described in Patent Literature 1, for example. In such technology, two-phase phase modulation signals and two-phase rotation detection signals of the resolver are input to an R/D conversion unit including a negative feedback system to determine a digital angle value (angle data) φ of the resolver.

There are also known R/D conversion systems corresponding to resolver systems described in Non Patent Literature 1 "JEM-TR 187 Glossary of terms and definitions for resolver systems."

CITATION LIST

Patent Literature

[PTL 1] JP 2018-109596 A

Non Patent Literature

[NPL 1] "JEM-TR 187 Glossary of terms and definitions for resolver systems" 1993

SUMMARY OF INVENTION

Technical Problem

However, with the technology described in Patent Literature 1, R/D conversion can be performed even under the signal open phase state, but there has been a problem in that there is a vibration error in the digital angle output. Further, in the R/D conversion systems described in Non Patent Literature 1, there has been a problem of inability to adapt to different resolver systems.

The present invention has been made to solve the above-mentioned problems, and therefore has an object to provide an R/D conversion method and an R/D converter with which R/D conversion can be performed on resolver signals in each case of a two-phase excitation/two-phase output type, a one-phase excitation/two-phase output type, and a two-phase excitation/one-phase output type, and an vibration error is suppressed.

Solution to Problem

In order to solve the above-mentioned problems, according to one embodiment of the present invention, there is provided an R/D conversion method of converting resolver signals of a resolver of anyone of a two-phase excitation/two-phase output type, a one-phase excitation/two-phase output type, or a two-phase excitation/one-phase output type into a digital angle value, the R/D conversion method including a step of removing a frequency band including a frequency component that is twice an excitation frequency of excitation signals of the resolver from the digital angle value.

Further, the R/D conversion method may further include a step of feeding back the digital angle value.

Further, the resolver may be a two-phase excitation/two-phase output resolver, the R/D conversion method may further include a step of outputting, by the resolver, the resolver signals having a phase difference that corresponds to an angle of the resolver with respect to the excitation signals, respectively, and the step of feeding back the digital angle value may include feeding back the digital angle value to the resolver signals.

Further, the resolver may be a two-phase excitation/two-phase output resolver, the step of feeding back the digital angle value may include feeding back the digital angle value to an excitation signal source of the excitation signals, and the excitation signals may be signals each having a phase difference that corresponds to the digital angle value.

Further, according to one embodiment of the present invention, there is provided an R/D converter for converting resolver signals of a resolver in each case of a two-phase excitation/two-phase output type, a one-phase excitation/two-phase output type, or a two-phase excitation/one-phase output type into a digital angle value, the R/D converter including a filter configured to remove a frequency band including a frequency component that is twice an excitation frequency of excitation signals of the resolver from the digital angle value.

Further, the R/D converter may further include a feedback control unit configured to feed back the digital angle value.

Further, the resolver may be a two-phase excitation/two-phase output resolver, and may be configured to output the resolver signals having a phase difference that corresponds to an angle of the resolver with respect to the excitation signals, respectively, and the feedback control unit for feeding back the digital angle value may be configured to feed back the digital angle value to the resolver signals.

Further, the resolver may be a two-phase excitation/two-phase output resolver, the feedback control unit for feeding back the digital angle value may be configured to feed back the digital angle value to an excitation signal source of the excitation signals, and the excitation signals may be signals each having a phase difference that corresponds to an angle of the digital angle value.

Advantageous Effects of Invention

According to the present invention, there are provided the R/D conversion method and the R/D converter for converting the resolver signals of the resolver of any one of the two-phase excitation/two-phase output type, the one-phase excitation/two-phase output type, or the two-phase excitation/one-phase output type into the digital angle value. In the R/D conversion method and the R/D converter, the frequency band including the frequency component that is twice the excitation frequency of the excitation signals of the resolver is removed from the digital angle value. Thus, it is possible to provide the R/D conversion method and the R/D converter with which the R/D conversion can be performed on the resolver signals in each case of the two-phase excitation/two-phase output type, the one-phase excitation/ two-phase output type, and the two-phase excitation/one-phase output type, and the vibration error is suppressed.

DESCRIPTION OF EMBODIMENTS

Now, embodiments of the present invention are described with reference to the accompanying drawings.

First Embodiment

Figure 1:
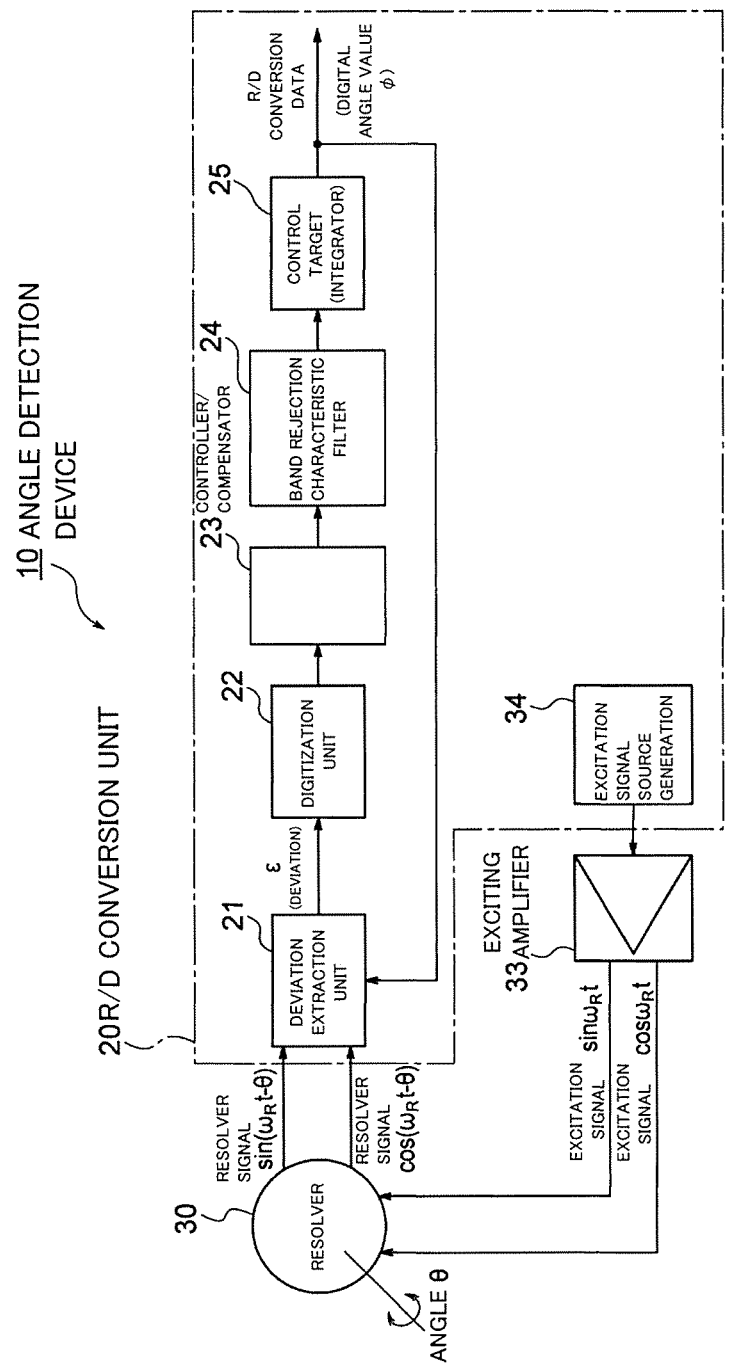
FIG. 1 is a block diagram for illustrating an example of a configuration including an R/D conversion unit in a first embodiment of the present invention.

FIG. 1 shows an example of a configuration of an angle detection device in a first embodiment of the present invention. An angle detection device 10 includes a resolver 30 and an R/D conversion unit 20, and can convert analog signals relating to rotation detection into a digital signal by executing the method described in this specification.

The R/D conversion unit 20 includes an excitation signal source 34, a deviation extraction unit 21, a digitization unit 22, a controller/compensator 23, a filter 24, and an integrator 25 being a control target. The excitation signal source 34 inputs a reference signal to an exciting amplifier 33. The exciting amplifier 33 generates two-phase excitation signals: an excitation signal sin $\omega_R t$ and an excitation signal cos $\omega_R t$, and outputs the generated two-phase excitation signals. An excitation frequency F and $\omega_R$ have the following relationship: $\omega_R = 2 \cdot \pi \cdot F$.

The resolver 30 is a resolver of a two-phase excitation/two-phase output type and a phase modulation type. When the two-phase excitation signals sin $\omega_R t$ and cos $\omega_R t$, which are orthogonal to each other, are input from the exciting amplifier 33 to the resolver 30, two-phase resolver signal sin($\omega_R t-\theta$) and resolver signal cos($\omega_R t-\theta$) are output.

The two-phase resolver signal sin($\omega_R t-\theta$) and resolver signal cos($\omega_R t-\theta$) are input to the R/D conversion unit 20. The R/D conversion unit 20 outputs an angle value $\varphi$ (digital angle value) being the digital signal as angle data (digital angle output) based on those two-phase phase-modulated analog signals (resolver signals).

For that purpose, the R/D conversion unit 20 includes the excitation signal source 34, the deviation extraction unit 21, the digitization unit 22, the controller/compensator 23, the filter 24, and the integrator 25 described above. The deviation extraction unit 21, the controller/compensator 23, the filter 24, and the integrator 25 form a negative feedback system, and the conversion from the analog signals to the digital signal is executed with use of the negative feedback system.

The resolver signals are input to the deviation extraction unit 21, and a deviation ε is extracted. The deviation s is input to the digitization unit 22. The signal obtained by the digitization in the digitization unit 22 is input to the controller/compensator 23, and is converted into an angular velocity signal. Here, the controller/compensator 23 is designed to have an integration characteristic so as to improve a characteristic of the negative feedback system and ensure stability.

The filter 24 is a band rejection characteristic filter, which attenuates or removes a signal of a particular frequency component to be described later of the angular velocity signal output from the controller/compensator 23, and passes a signal of the other frequency components to be output to the integrator 25. The integrator 25 accumulates the angular velocity signals to obtain the digital angle value $\varphi$.

The digital angle value $\varphi$ is output as R/D conversion data $\varphi$ from the R/D conversion unit 20. The digital angle value $\varphi$ is also fed back from the integrator 25 to the deviation extraction unit 21. In other words, the deviation extraction unit 21, the digitization unit 22, the controller/compensator 23, the filter 24, and the integrator 25 form a feedback control unit.

The extraction of the deviation ε in the deviation extraction unit 21, the digitization of the signals in the digitization unit 22, the generation of the angular velocity signal in the control unit/compensator 23, and the obtainment of the digital angle value $\varphi$ in the integrator 25 are performed as in an R/D conversion unit known in the related art.

Figure 2:
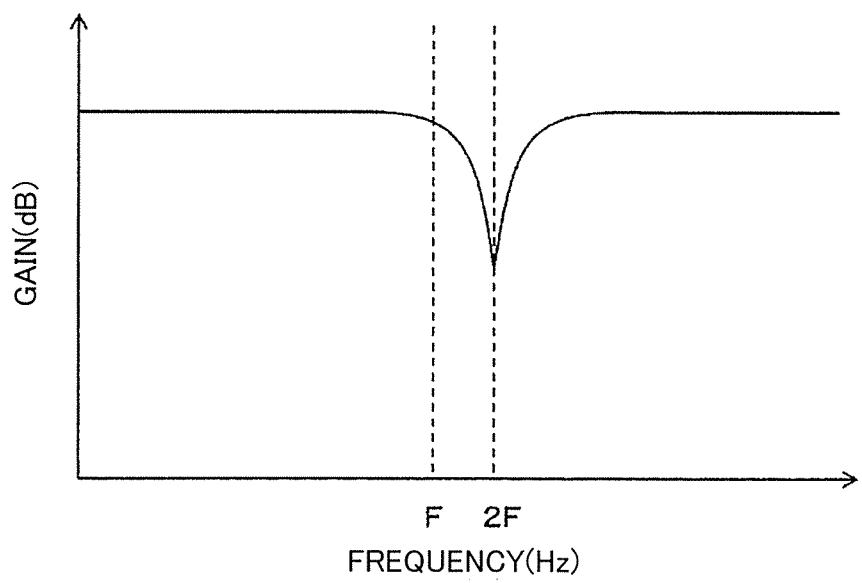
FIG. 2 is a schematic graph for showing a characteristic of a filter illustrated in FIG. 1.

Further, FIG. 2 shows a frequency characteristic of the filter 24, and the filter 24 of the R/D conversion unit 20 is configured to attenuate or remove a signal of a frequency component 2F that is twice the excitation frequency F of the excitation signal source 34. Consequently, even when any one of the two-phase excitation signals or any one of the two-phase resolver signals is missing, the digital conversion in the R/D conversion unit 20 can continue R/D conversion as in the R/D conversion unit known in the related art, and can perform R/D conversion with which an vibration error is suppressed.

As described above, there is provided an R/D conversion method of converting resolver signals of the resolver 30 of any one of a two-phase excitation/two-phase output type, a one-phase excitation/two-phase output type, or a two-phase excitation/one-phase output type into the digital angle value $\varphi$, and the R/D conversion method includes a step of removing the frequency band including the frequency component that is twice the excitation frequency of the excitation signals of the resolver 30 from the digital angle value $\varphi$. Consequently, there can be provided the R/D conversion method with which the R/D conversion can be performed on the resolver signals in each case of the two-phase excitation/two-phase output type, the one-phase excitation/two-phase output type, and the two-phase excitation/one-phase output type, and the vibration error is suppressed.

Further, the R/D conversion method further includes a step of feeding back the digital angle value $\varphi$, and hence R/D conversion by the negative feedback system can be performed.

Still further, the resolver 30 is a two-phase excitation/two-phase output resolver, the R/D conversion method further includes a step of outputting, by the resolver 30, the resolver signals having a phase difference that corresponds to an angle of the resolver with respect to the excitation signals, respectively, and the step of feeding back the digital angle value $\varphi$ includes feeding back the digital angle value $\varphi$ to the resolver signals. Consequently, the R/D conversion by the negative feedback system can be performed.

Further, there is provided the R/D conversion unit 20 for converting the resolver signals of the resolver 30 of any one of the two-phase excitation/two-phase output type, the one-phase excitation/two-phase output type, or the two-phase excitation/one-phase output type into the digital angle value $\varphi$, and the R/D conversion unit 20 includes the filter 24 configured to remove the frequency band including the frequency component that is twice the excitation frequency of the excitation signals of the resolver 30 from the digital angle value. Consequently, there can be provided the R/D converter with which the R/D conversion can be performed on the resolver signals in each case of the two-phase excitation/two-phase output type, the one-phase excitation/two-phase output type, and the two-phase excitation/one-phase output type, and the vibration error is suppressed.

Further, the RID converter further includes the feedback control unit configured to feed back the digital angle value φ, and hence RID conversion by the negative feedback system can be performed.

Still further, the resolver 30 is a two-phase excitation/two-phase output resolver, and outputs the resolver signals having the phase difference that corresponds to the angle of the resolver, respectively. In the feedback control unit configured to feed back the digital angle value φ, the R/D conversion by the negative feedback system for feeding back the digital angle value φ to the resolver signals can be performed.

Second Embodiment

Next, a configuration of an angle detection device in a second embodiment of the present invention is described. In the following embodiment, the same symbols as the reference symbols of FIG. 1 and FIG. 2 are the same or similar components, and hence a detailed description thereof is omitted.

The configuration of the angle detection device in the second embodiment is different from that of the first embodiment in that a digital angle value φ is fed back to the excitation signal source.

Figure 3:
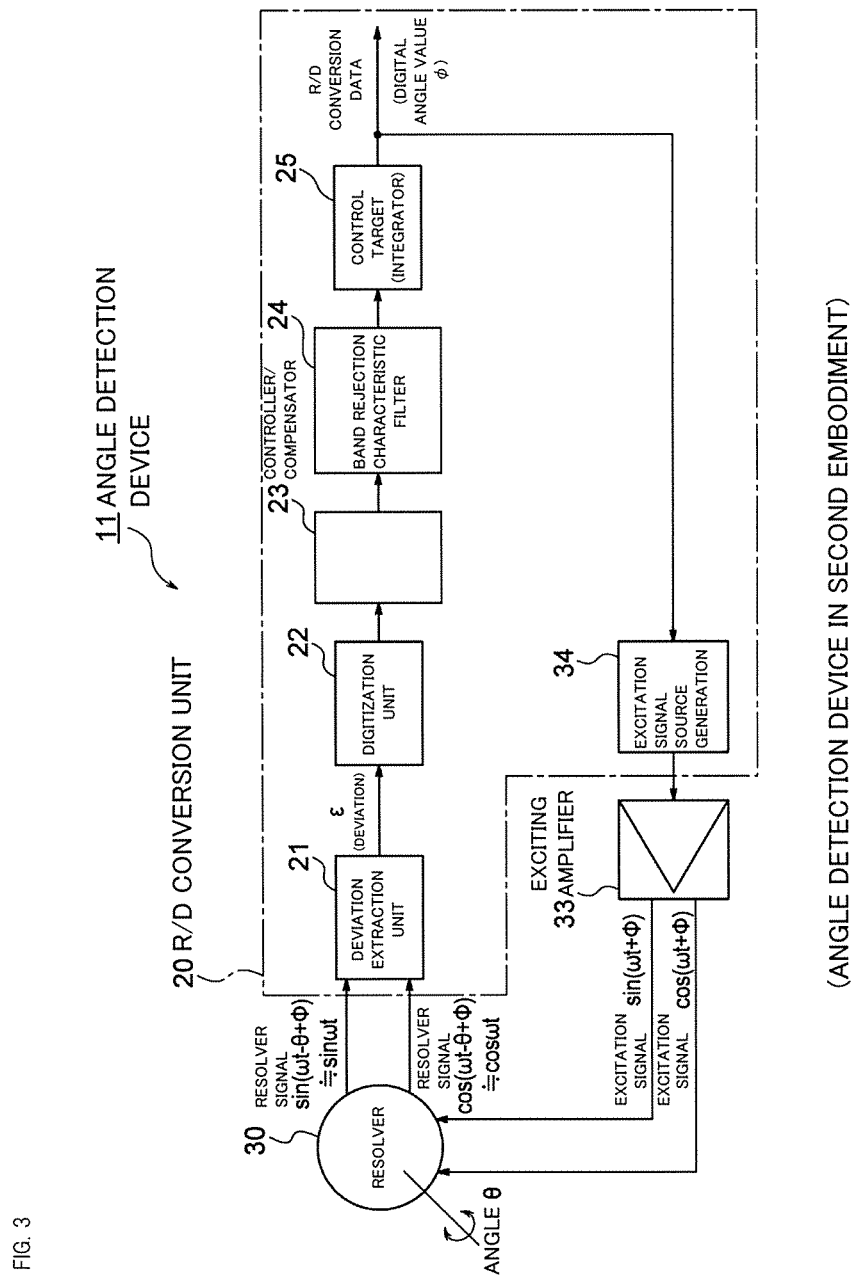
FIG. 3 is a block diagram for illustrating an example of a configuration including an R/D conversion unit in a second embodiment of the present invention.

As illustrated in FIG. 3, the digital angle value φ of the R/D conversion unit 20 is fed back to the excitation signal source 34 of an angle detection device 11, and is offset by a reference frequency signal ωt. In other words, in order to extract a deviation s of a negative feedback system, the digital angle value φ is offset by the reference frequency signal ωt in the excitation signal source 34 of the excitation signals. The exciting amplifier 33, to which the signal from the excitation signal source 34 has been input, generates and outputs the excitation signal sin(ωt+φ) and the excitation signal cos(ωt+φ), which are the two-phase excitation signals each having a phase difference that corresponds to the digital angle value φ with respect to the reference frequency signal ωt. An excitation frequency F and ω have the following relationship: ω=2·π·F.

The resolver 30 is a resolver of a two-phase excitation/two-phase output type and a phase modulation type. When the two-phase excitation signal sin(ωt+φ) and excitation signal cos(ωt+φ), which are orthogonal to each other, are input from the exciting amplifier 33, the resolver 30 outputs two-phase resolver signal sin(ωt−θ+φ) and resolver signal cos(ωt−θ+φ). At this time, sin(ωt−θ+φ) approximates sin ωt, and cos(ωt−θ+φ) approximates cos ωt.

The two-phase resolver signal sin(ωt−θ+φ) and resolver signal cos(ωt−θ+φ) are input to the R/D conversion unit 20. The R/D conversion unit 20 outputs a digital angle value φ being the digital signal as angle data (digital angle output) based on those two-phase phase-modulated analog signals.

For that purpose, the deviation extraction unit 21, the controller/compensator 23, the filter 24, the integrator 25, and the excitation signal source 34 form the negative feedback system, and conversion from analog signals to a digital signal is executed with use of the negative feedback system. In other words, the deviation extraction unit 21, the controller/compensator 23, the filter 24, the integrator 25, and the excitation signal source 34 form a feedback control unit. Consequently, the digital angle value φ is obtained as R/D conversion data from the R/D conversion unit 20.

As in the first embodiment, the extraction of the deviation ε in the deviation extraction unit 21, the digitization of the signals in the digitization unit 22, the generation of the angular velocity signal in the control unit/compensator 23, and the obtainment of the digital angle value φ in the integrator 25 are performed as in the R/D conversion unit known in the related art.

Further, the filter 24 is configured to attenuate or remove a signal in a frequency band including a frequency component 2F that is twice the excitation frequency F of the excitation signal source 34. Consequently, even when any one of the two-phase excitation signals or any one of the two-phase resolver signals is missing, the digital conversion in the R/D conversion unit 20 can continue R/D conversion as in the R/D conversion unit known in the related art, and can perform R/D conversion with which an vibration error is suppressed.

In other words, an R/D conversion method according to the second embodiment includes a step of attenuating or removing the frequency band including the frequency component 2F that is twice the excitation frequency F of the excitation signals of the resolver 30 from the digital angle value φ. Consequently, there can be provided the R/D conversion method with which the R/D conversion can be performed on the resolver signal in each case of the two-phase excitation/two-phase output type, the one-phase excitation/two-phase output type, and the two-phase excitation/one-phase output type, and the vibration error is suppressed.

As described above, the resolver 30 is a two-phase excitation/two-phase output resolver, the step of feeding back the digital angle value φ includes feeding back the digital angle value to the excitation signal source of the excitation signals, and the excitation signals are signals having the phase difference that corresponds to the digital angle value φ. Therefore, R/D conversion by the negative feedback system can be performed as in the first embodiment.

Further, the resolver 30 is a two-phase excitation/two-phase output resolver, the feedback control unit for feeding back the digital angle value feeds back the digital angle value φ to the excitation signal source of the excitation signals, and the excitation signals are signals having the phase difference that corresponds to the digital angle value φ. Therefore, an R/D converter which is similar to that of the first embodiment can be provided.

In the first and second embodiments of the present invention, the digitization unit 22 is provided between the deviation extraction unit 21 and the controller/compensator 23, but the digitization unit 22 may be provided at any position from the resolver signal inputs in the preceding stage of the deviation extraction unit 21 to the angular velocity signal input to the integrator 25.

Further, in the negative feedback system included in the R/D conversion unit 20, the filter 24 is provided between the controller/compensator 23 and the integrator 25, but may be provided at any position in the negative feedback system included in the R/D conversion unit 20 and from the deviation extraction unit 21 to the obtainment of the digital angle value φ. Alternatively, instead of being provided in the negative feedback system included in the R/D conversion unit 20, the filter 24 may be arranged outside the negative feedback system so that the digital angle value φ is input to the filter 24, and may be provided so that the vibration error of the digital angle value φ can be suppressed.

REFERENCE SIGNS LIST

20 R/D conversion unit (R/D converter), 24 filter, 30 resolver, φ digital angle value

The invention claimed is:

1. An resolver digital conversion method of converting resolver signals of a resolver of any one of a two-phase excitation/two-phase output type, a one-phase excitation/two-phase output type, or a two-phase excitation/one-phase output type into a digital angle value,
  the R/D conversion method comprising a step of removing a frequency band including a frequency component that is twice an excitation frequency of excitation signals of the resolver from the digital angle value.

2. The R/D conversion method according to claim 1, further comprising a step of feeding back the digital angle value.

3. The R/D conversion method according to claim 2,
  wherein the resolver is a two-phase excitation/two-phase output resolver,
  wherein the R/D conversion method further comprises a step of outputting, by the resolver, the resolver signals having a phase difference that corresponds to an angle of the resolver with respect to the excitation signals, respectively, and
  wherein the step of feeding back the digital angle value includes feeding back the digital angle value to the resolver signals.

4. The R/D conversion method according to claim 2,
  wherein the resolver is a two-phase excitation/two-phase output resolver,
  wherein the step of feeding back the digital angle value includes feeding back the digital angle value to an excitation signal source of the excitation signals, and
  wherein the excitation signals are signals each having a phase difference that corresponds to the digital angle value.

5. An R/D converter for converting resolver signals of a resolver of any one of a two-phase excitation/two-phase output type, a one-phase excitation/two-phase output type, or a two-phase excitation/one-phase output type into a digital angle value,
  the R/D converter comprising a filter configured to remove a frequency band including a frequency component that is twice an excitation frequency of excitation signals of the resolver from the digital angle value.

6. The R/D converter according to claim 5, further comprising a feedback control unit configured to feed back the digital angle value.

7. The R/D converter according to claim 6,
  wherein the resolver is a two-phase excitation/two-phase output resolver,
  wherein the resolver is configured to output the resolver signals having a phase difference that corresponds to an angle of the resolver with respect to the excitation signals, respectively, and
  wherein the feedback control unit for feeding back the digital angle value is configured to feed back the digital angle value to the resolver signals.

8. The R/D converter according to claim 6,
  wherein the resolver is a two-phase excitation/two-phase output resolver,
  wherein the feedback control unit for feeding back the digital angle value is configured to feed back the digital angle value to an excitation signal source of the excitation signals, and
  wherein the excitation signals are signals each having a phase difference that corresponds to the digital angle value.

* * * * *